(12) United States Patent
Gao

(10) Patent No.: US 12,096,604 B2
(45) Date of Patent: Sep. 17, 2024

(54) HIGH COOLING EFFICIENCY DATA CENTER INCLUDING DIFFERENT SERVER CLUSTER COOLING TYPES

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 373 days.

(21) Appl. No.: 17/701,396

(22) Filed: Mar. 22, 2022

(65) Prior Publication Data

US 2023/0309271 A1    Sep. 28, 2023

(51) Int. Cl.
*H05K 7/20* (2006.01)
(52) U.S. Cl.
CPC ......... *H05K 7/20818* (2013.01); *H05K 7/203* (2013.01); *H05K 7/20318* (2013.01); *H05K 7/20745* (2013.01)
(58) Field of Classification Search
CPC ............... H05K 7/20818; H05K 7/203; H05K 7/20318; H05K 7/20745; H05K 7/2059
See application file for complete search history.

(56) References Cited

U.S. PATENT DOCUMENTS

| 3,614,693 | A | * | 10/1971 | Frey, III | H01F 27/18 174/15.1 |
| 4,501,123 | A | * | 2/1985 | Ina | H01F 27/18 62/119 |
| 10,206,307 | B2 | * | 2/2019 | Lau | H05K 7/203 |
| 11,076,508 | B2 | * | 7/2021 | Gao | H05K 7/20836 |
| 11,363,737 | B2 | * | 6/2022 | Rogers | H05K 7/1489 |
| 2017/0325355 | A1 | * | 11/2017 | Lau | H05K 7/20381 |
| 2019/0357378 | A1 | * | 11/2019 | Kolar | H05K 7/20327 |
| 2021/0153392 | A1 | * | 5/2021 | Gao | H05K 7/20818 |
| 2021/0410320 | A1 | * | 12/2021 | Yang | H05K 7/20318 |
| 2023/0156973 | A1 | * | 5/2023 | Musilli, Jr. | H05K 7/20745 454/184 |

FOREIGN PATENT DOCUMENTS

GB    2576571 A * 2/2020 ........... H05K 7/1497

* cited by examiner

*Primary Examiner* — Devon Russell
(74) *Attorney, Agent, or Firm* — WOMBLE BOND DICKINSON (US) LLP

(57) ABSTRACT

Systems and methods to provide a prefabricated module design for heterogeneous data centers are described. The heterogenous data centers includes multiple IT clusters designed with different power density scales which are designed with different types of thermal management systems, including two phase coolant immersion system and air cooling system. The data centers may include gas-to-gas heat exchange core for allowing vapor of a two-phase immersion cooling system to exchange heat with air of an air cooling system. In an embodiment, both of the IT clusters are designed with a dedicated containment structure and system for the vapor and air management.

20 Claims, 8 Drawing Sheets

800

```
┌─────────────────────────────────────────┐
│ Receive, at a vapor condensation region │
│ of a core unit, vapor of a two-phase    │
│ cooling fluid from a first type of      │──810
│ cooling enclosures comprising immersion │
│ tanks, the first type of cooling        │
│ enclosures cooled by closed             │
│ two-phase cooling                       │
└─────────────────────────────────────────┘
                    │
                    ▼
┌─────────────────────────────────────────┐
│ Receive, at a hot air region of the     │──820
│ core unit, hot air from a second type   │
│ of cooling enclosures cooled by cool air│
└─────────────────────────────────────────┘
                    │
                    ▼
┌─────────────────────────────────────────┐
│ Exchange heat between the vapor         │──830
│ condensation region and the hot air     │
│ region                                  │
└─────────────────────────────────────────┘
                    │
                    ▼
┌─────────────────────────────────────────┐
│ Return at least a portion of the        │
│ condensed vapor after exchanging heat   │
│ to the immersion tanks of the first     │
│ type of cooling enclosures, wherein the │
│ first type of cooling enclosures are    │──840
│ situated in a system layer enclosing a  │
│ plurality rows of enclosures of         │
│ electronic racks, the plurality rows of │
│ enclosures comprising the first type of │
│ cooling enclosures and the second type  │
│ of cooling enclosures                   │
└─────────────────────────────────────────┘
```

FIG. 8

HIGH COOLING EFFICIENCY DATA CENTER INCLUDING DIFFERENT SERVER CLUSTER COOLING TYPES

FIELD

Embodiments of the present disclosure relate generally to data center cooling.

BACKGROUND

Cooling is a prominent factor in a computer system and data center design. The number of high performance electronics components such as high performance processors packaged inside servers has steadily increased, thereby increasing the amount of heat generated and dissipated during the ordinary operations of the servers. The reliability of servers used within a data center decreases if the environment in which they operate is permitted to increase in temperature over time. Maintaining a proper thermal environment is critical for normal operations of these servers in data centers, as well as the server performance and lifetime. It requires more effective and efficient cooling solutions especially in the cases of cooling these high performance servers.

The conventional cooling solutions for designing modular clusters do not consider different fluid systems and different cluster requirements. In addition, the conventional solutions may not be used for accommodating different information technology (IT) clusters to coexist together.

BRIEF DESCRIPTION OF THE DRAWINGS

The appended drawings illustrate examples and are, therefore, exemplary embodiments and not considered to be limiting in scope.

FIG. 8 is a flow chart of example operations of a data center including IT clusters of different cooling types, according to one embodiment of the present disclosure.

Like numerals indicate like elements.

DETAILED DESCRIPTION

Figure 1:
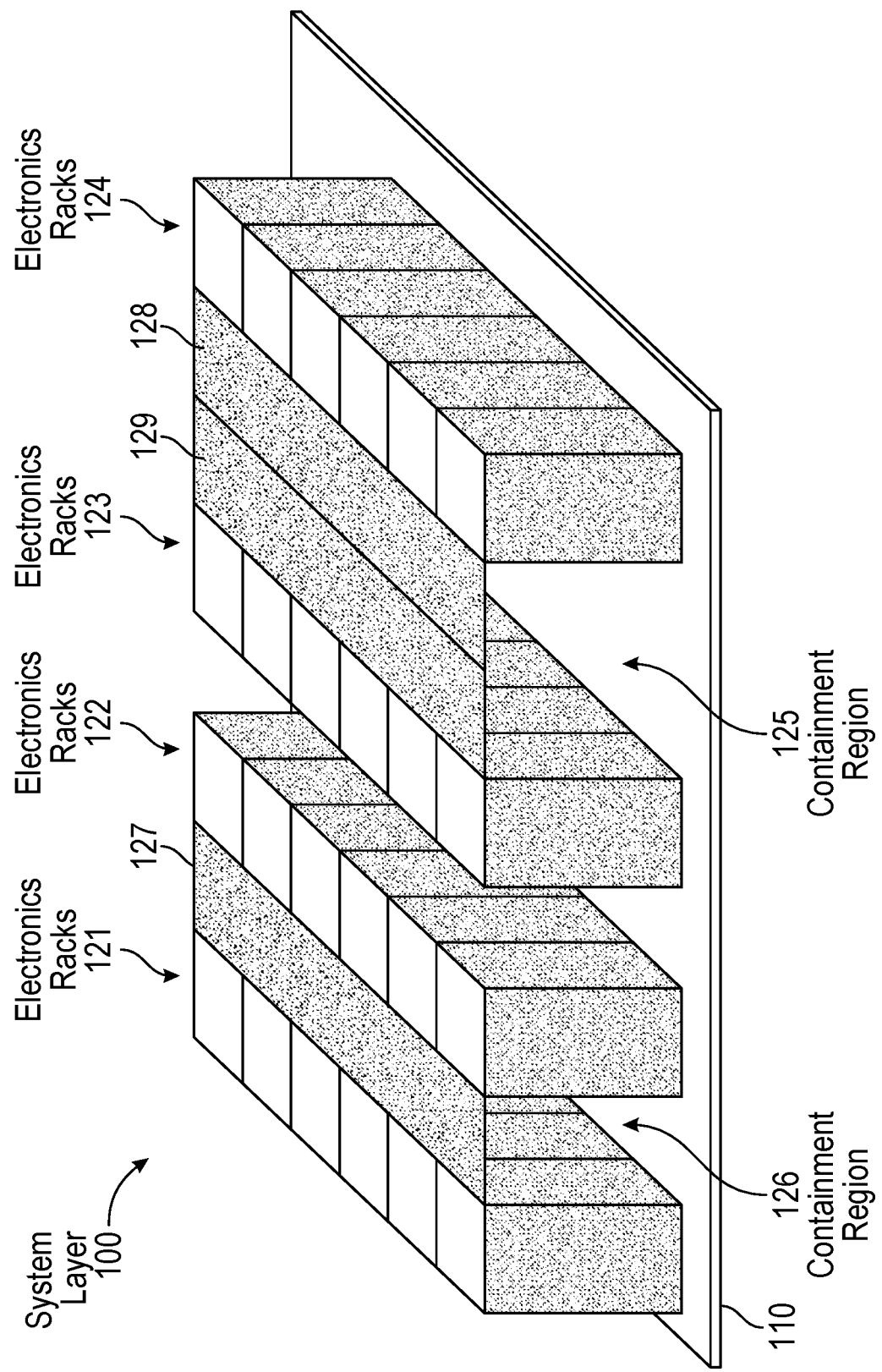
FIG. 1 illustrates a perspective view of at least a portion of a data center including information technology (IT) clusters, according to one embodiment of the present disclosure.

Systems and methods to provide a prefabricated module design for heterogeneous data centers are described. An advanced modular design is used to manufacture a highly prefabricated system to configure different heterogeneous information technology (IT) clusters. The term "heterogeneous" as described in the application indicates that different types of IT configurations and cooling systems coexist in one cluster. For example, one type of IT cooling systems uses cold air for cooling only (e.g., an air cooling type). One type of IT cooling system uses two-phase fluid cooling (e.g., cooled by latent heat when a coolant transforms from the liquid state to the gaseous state).

Often, data center architectures are mainly designed for one type of systems or one type of IT clusters. Such single-type cluster designs often may not satisfy needs for modern data centers including multiple different types of IT clusters. The present disclosure provides an architecture for data centers having at least two different types of cooling, including two-phase immersion systems and air system. The disclosed architecture may achieve high efficiency by allowing one type of cooling mechanism of one cooling type to remove heat from a second, different cooling type, so that the temperature differential of the one type of cooling mechanism and the surrounding environment is increased, resulting in an increased heat transfer rate.

In an example, a data center includes multiple rows of enclosures of electronic racks. The multiple rows of enclosures include a first type of cooling enclosures using air cooling ("air cooling enclosures"), and a second type of cooling enclosures using two-phase cooling ("two-phase immersion cooling enclosures"). The data cooling system includes a system layer that encloses at least part of the multiple rows of enclosures, such that at least hot aisles of the air cooling enclosures and immersion tanks of the two-phase cooling enclosures are enclosed in the system layer. The cooling system further includes a containment layer on top of the system layer. The containment layer includes a vapor containment and a hot air containment. The vapor containment is connected to the immersion tanks of the two-phase cooling enclosures. The hot air containment is connected with hot aisles of the air cooling enclosures. The cooling system further includes a heat exchanger to separately receive vapor from the vapor containment and hot air from the hot air containment to allow for heat exchange between the vapor and hot air.

In some embodiments, the data center cooling system further includes a return conduit connecting the heat exchanger to the system layer for returning a condensed portion of the vapor after the heat exchange to the immersion tanks of the second type of cooling enclosures.

In some embodiments, the data center cooling system further includes a cooling air supply coupled to the first type of cooling enclosures in the system layer, the cooling air supply providing fresh cool air to the first type of cooling air enclosures; and a hot air exit coupled to the heat exchanger for removing hot air in the heat exchanger after heat exchange between the vapor and the hot air.

In some embodiments, the data center cooling system further includes an internal vapor cooling unit in the containment layer for cooling vapor in the vapor containment and condense a portion of the vapor to return to the immersion tanks of the second type of cooling enclosures. In some cases, the internal vapor cooling unit comprises a liquid based cooling condenser and is to condense the portion of the vapor such that the heat exchanger liquefies a remainder of the vapor for returning to the immersion tanks of the second type of cooling enclosures. In some cases, the data center cooling system further includes a number of liquid lines for returning condensed vapor from the internal vapor cooling unit and the heat exchanger to the immersion tanks of the second type of cooling enclosures.

In some embodiments, the data center cooling system further includes a blower in the hot air containment or the vapor containment to vary the rate of heat exchange between the vapor and the hot air by controlling a rate of input of fresh cool air to the first type of cooling enclosures or a rate of input of vapor to enter the heat exchanger.

In at least one embodiment, the cooling apparatuses are designed for rows of electronic racks. In at least one embodiment, a cooling apparatus is designed to be on a top of an electronic rack. The cooling apparatus is used to enable fluid connections between an individual electronic rack and external sources. The cooling apparatus includes fluid lines and fluid connection ports. The cooling apparatus also includes a vapor collector and a cooler on a top of the vapor collector. The cooler is used for cooling an airflow and/or a vapor flow. In at least some embodiment, the cooler is a part of an air-to-liquid heat exchanger. The cooling apparatus includes a main chassis and an extension chassis. The main chassis is at fixed locations on the electronic rack. The extension chassis is extended during normal operation. The fluid lines are fixed at the main chassis during the operation, as described in further detail below.

In at least some embodiments, a modular and prefabricated architecture for a data center cluster is used for deploying heterogeneous IT systems. At least some embodiments of the disclosure provide a high efficiency cooling system architecture for design and deployment of heterogeneous information technology (IT) clusters. At least some embodiments of the disclosure provide a hyperscale heterogeneous data center cooling system. At least some embodiments of the disclosure provide an efficient facility side design with containment solution integration. At least some embodiments of the disclosure provide a co-design of the facility and an IT container. At least some embodiments of the disclosure provide an integration of different cooling technologies. Embodiments of the heterogeneous prefabricated module design provide high reliability, fast design, fabricate, build and deployment and scalable solution for different use cases. At least some embodiments of the disclosure enable different containment designs. At least some embodiments of the disclosure provide a highly integrated architecture and enable coexisting of different IT systems. At least some embodiments of the disclosure provide different types of servers coexisting in one cluster. At least some embodiments of the disclosure accommodate repaid changing of the systems, as described in further detail below.

Various embodiments and aspects of the present disclosure will be described with reference to details discussed below, and the accompanying drawings will illustrate various embodiments. The following description and drawings are illustrative of the disclosure and are not to be construed as limiting. Numerous specific details are described to provide a thorough understanding of various embodiments of the present disclosure. However, in certain instances, well-known or conventional details are not described in order to provide a concise discussion of embodiments of the present disclosure.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

FIG. 1 illustrates a perspective view of at least a portion of a data center including information technology (IT) clusters, according to one embodiment of the present disclosure. The data center may be referred to as a system layer 100, which is illustrated in a perspective view including multiple IT clusters in FIG. 1. The system layer 100 includes multiple rows or clusters of enclosures of electronic racks. A row of enclosures herein may be used to describe any forms of grouping, clustering, arranging, or configuration of enclosing two or more electronic racks as a management unit in a data center. A "row" of enclosures may refer to an actual physical row of enclosures, and may also refer to any equivalent grouping (e.g., may be referred to as a file, a column, a stack, a tower, and the like), depending on application specific orientation or other configuration requirements. For illustrative purposes, examples herein use rows of enclosures for ease of description, without limiting the present disclosure to actual rows of enclosures.

As shown, a row of electronic racks 121 and a row of electronic racks 122 are spaced apart by an aisle. The electronic racks 121 and 122 may employ air cooling enclosures such that constantly flowing air removes heat from the electronic racks 121 and 122. As shown, a cooling device (apparatus) 127 is placed on a top of electronic racks 121. For example, the cooling device 127 may remove, replace, or cool the hot air carrying heat from the racks 121 and 122.

As shown in FIG. 1, the cooling apparatus 127 is extended to a top portion of the electronic racks 121 to form a contained environment (containment region) 126 within the aisle. The containment region 126 is within the opposing sidewalls of the electronic racks 121 and 122, the extended portion of the cooling apparatus 127 and a floor 110. In general, the containment region 126 may be in any form of enclosure that contains and/or controls the boundary of cooling fluids.

The system layer 100 further includes a row of electronic racks 123 and a row of electronic racks 124. One or both of the electronic racks 123 and 124 may employ two-phase cooling enclosures such that cooling is performed by absorbing latent heat when a two-phase fluid transforms from liquid to vapor (and thus including a mixture thereof). A respective cooling apparatus 128 or 129 is placed on a top of respective electronic racks 124 or 123. The cooling apparatuses 128 and 129 are extended towards each other to form a containment region 125 within the aisle (e.g., when at least one of the electronic racks 123 and 124 uses air cooling). In the illustrated example, the containment region 125 is within the opposing sidewalls of the electronic racks 123 and 124, the extended portions of the cooling apparatuses 128 and 129 and floor 110. The containment region 125 represents a double side extension environment.

In some embodiments, an air cooling type enclosure (e.g., the electronic racks 121 and 122) may also be referred to as air cooling type IT clusters herein. Often, multiple electronic racks form clusters (e.g., rows) that are arranged in different rows; (e.g., the containment region 126 of FIG. 1). The air cooling type IT clusters use cool air flowing through the multiple electronic racks to remove heat therein. The exhaust air (e.g., air that has passed through the IT clusters) are moved to another location for removal or cooling.

Figure 2:
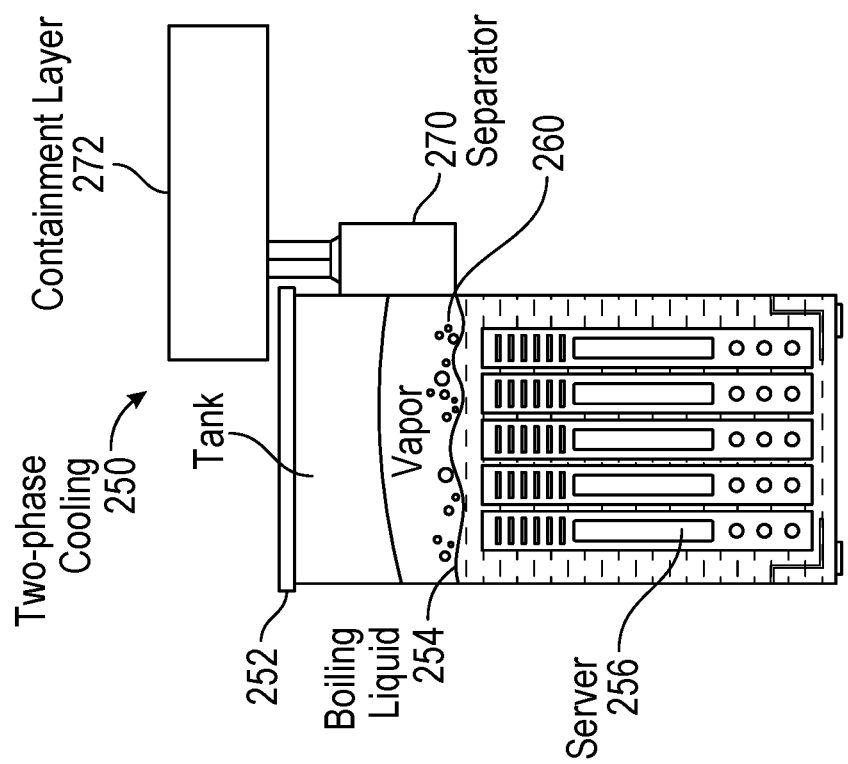
FIG. 2 illustrates an example a two-phase cooling type enclosure belonging to at least a portion of the IT clusters of FIG. 1, according to one embodiment of the present disclosure.

FIG. 2 illustrates an example a two-phase cooling type enclosure 250 belonging to at least a portion of the IT clusters of FIG. 1, according to one embodiment of the present disclosure. As shown, the two-phase cooling type enclosure 250 includes an immersion tank 252, in which one or more servers 256 are situated. The one or more servers 256 are submerged in the two-phase coolant 254. Part of the two-phase coolant 254 is transformed into vapor 260 having absorbed the heat from the one or more servers 256. In some cases, a separator 270 removes the vapor 260 to a containment layer 272. Either the separator 270 or the containment layer 272 may facilitate heat exchange to remove the heat in the vapor and return the two-phase coolant as liquid to the immersion tank 252.

Figure 3:
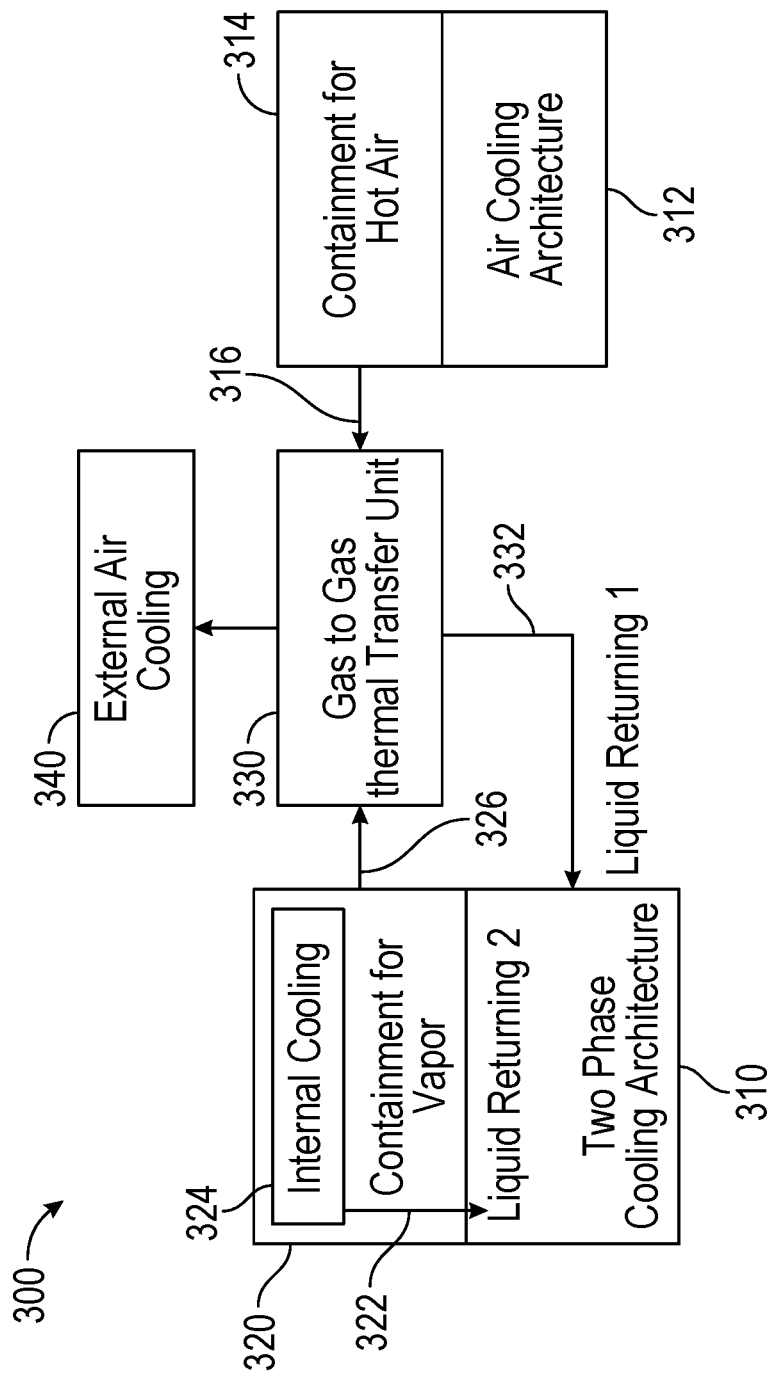
FIG. 3 illustrates an example schematic for a data center cooling architecture including IT clusters of different cooling types, according to one embodiment of the present disclosure.

FIG. 3 illustrates an example schematic for a data center cooling architecture 300 including IT clusters of different cooling types, according to one embodiment of the present disclosure. The data center 300 includes two types of gas management systems (e.g., one for air cooling, the other for vapor of two-phase cooling). As shown, the two-phase cooling architecture 310 includes one or more cooling enclosures that employ two-phase cooling. On the same system layer, the air cooling architecture 312 includes one or more cooling enclosures that employ air cooling. The air cooling architecture 312 may be connected to (e.g., directly underneath, as hot air rises) a hot air containment 314, which transfers hot air 316 to a gas-to-gas thermal transfer unit 330. It needs to be note that the "hot air" 316 is "hot" relative to the cooling air supplied to the air cooling architecture. It can be understood as the cooling air for the gas to gas thermal transfer unit.

The two-phase cooling architecture 310 may include one or more servers surrounded by two-phase coolant in one or more immersion tanks. A vapor containment 320 is on top of the two-phase cooling architecture 310 to receive vapor that is transformed from the two-phase coolant in the one or more immersion tanks. The vapor containment 320 may include an internal cooling device 324 for removing part of the heat carried in the vapor, and returns a portion of the condensed vapor via the return line 322 to the one or more immersion tanks.

The vapor containment 320 may transfer a remaining portion (e.g., a major or substantial portion) of the vapor 326 to the gas-to-gas thermal transfer unit 330. The gas-to-gas thermal transfer unit 330 may fully condense the vapor 326 transferred from the vapor containment 320 and return the condensed vapor 332 to the two-phase cooling architecture 310. The gas-to-gas thermal transfer unit 330 removes the heat from the vapor by facilitating heat transfer between the vapor and the air 316 received from the hot air containment 314. For example, the hot air 316 may have a higher temperature than the room air temperature (e.g., fresh cooling air temperature before entering the air cooling architecture 312) but a lower temperature that can cause the vapor 326 to be condensed to liquid.

As such, the air 316 and the vapor 326 may conduct gas-to-gas heat transfer in the gas-to-gas thermal transfer unit 330. During operation, the vapor 326 is condensed and returned to the immersion tanks of the two-phase cooling architecture 310. The hot air 316, after taking on the heat from the vapor 326 in the gas-to-gas thermal transfer unit 330, may be transferred to an external heat exchanger 340 for cooling or removed from the data center 300. The internal cooling 324 can be either designed as a separate unit in the containment layer or it can be integrated to each of the immersion enclosure.

Figure 4:
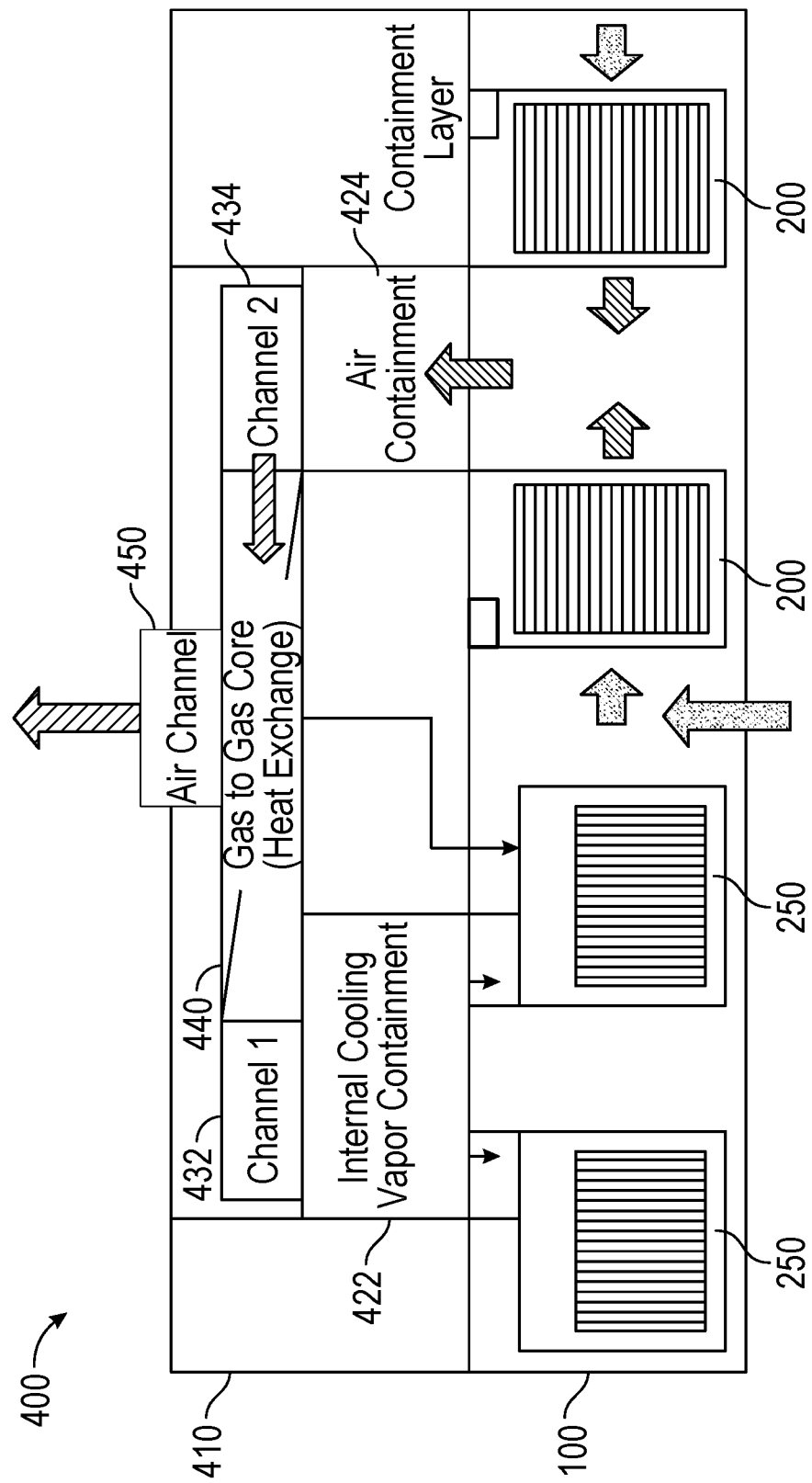
FIG. 4 illustrates an example data center including IT clusters of different cooling types of the schematic in FIG. 3, according to one embodiment of the present disclosure.

FIG. 4 illustrates an example high cooling efficiency data center 400 including IT clusters of different cooling types of the schematic in FIG. 3, according to one embodiment of the present disclosure. As shown, the data center 400 includes one or more of the two-phase cooling enclosures 250 and the air cooling enclosures 402 (two or each illustrated). In some cases, the IT racks of the air cooling enclosures 402 are arranged in a hot aisle containment configuration (e.g., similar to the configurations in FIG. 1). The layer including the different types of cooling enclosures is referred to as an IT layer or system layer (e.g., the system layer 100 of FIG. 1). A containment layer 410 is positioned above the system layer 100.

The containment layer 410 may include a vapor containment 422 and an air containment 424. The vapor containment 422 is connected to the individual immersion tanks in the two-phase cooling enclosures 250. The vapor containment 422 is used for receiving the vapor generated within the immersion tanks. The air containment 424 is connected with the top of the hot aisle containment of the air cooling enclosures 402 for receiving the exhaust air, which may rise into the air containment 424 due to a higher temperature than the air supplied to the air cooling enclosures 402 or may be transferred by power (e.g., fan powered).

The vapor containment 422 and the air containment 424 are connected to the gas-to-gas heat exchanger 440, respectively via the channel 432 and the channel 434. Within the gas-to-gas heat exchanger 440, the heat carried by the vapor may be transferred to the air from the air containment 424. The gas-to-gas heat exchanger 440 may be connected to an air channel 450 (e.g., an exit) to conduct the hot air to exit the containment layer 410. The illustrated configuration therefore separates the two types of gases (i.e., the air from the air containment 424 and the vapor from the vapor containment 422) in both the channels 432 and 434, as well as in the gas-to-gas heat exchanger 440.

Figure 5:
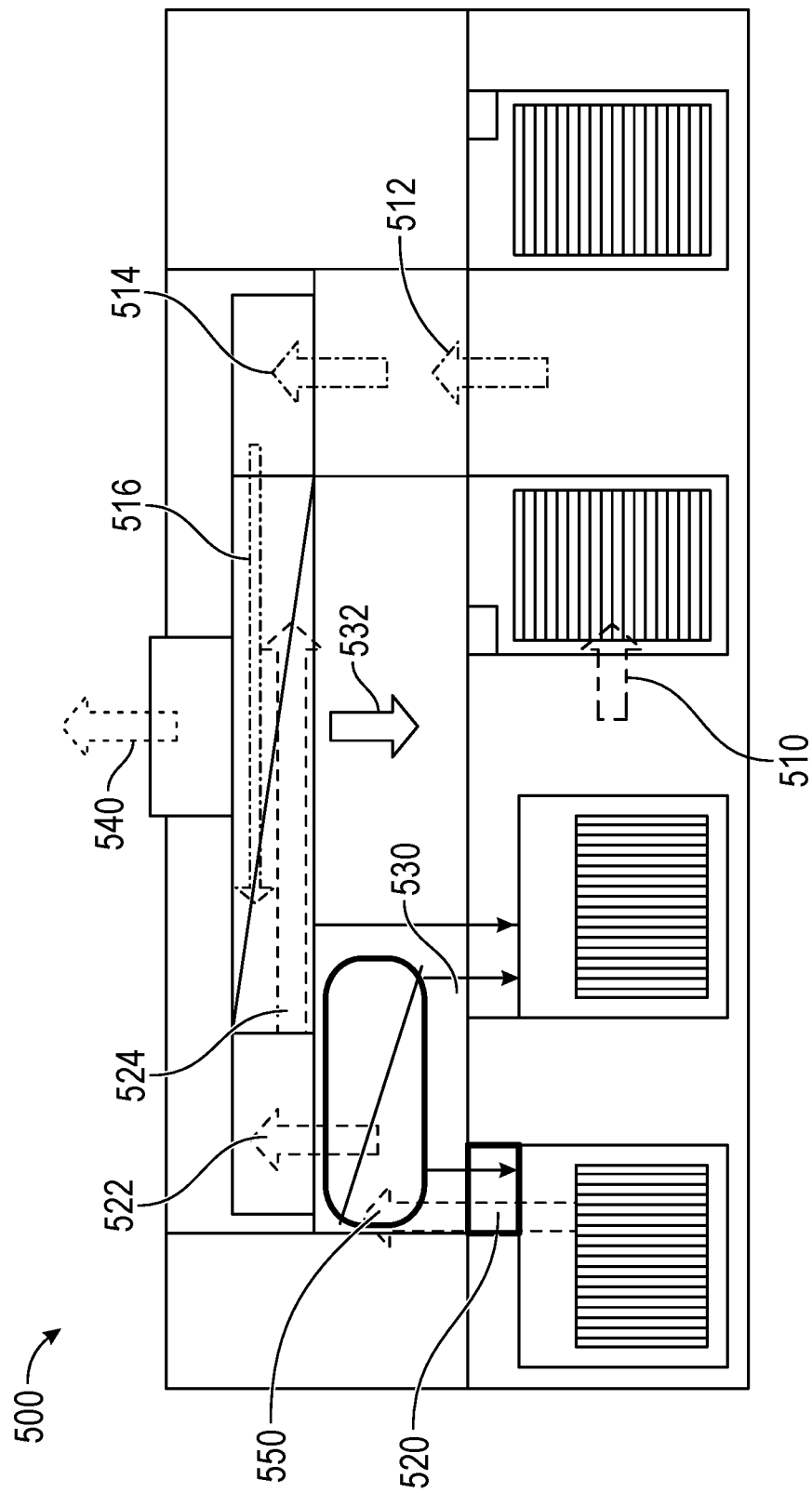
FIG. 5 illustrates an example coolant flow schematic in the data center of FIG. 4, according to one embodiment of the present disclosure.

FIG. 5 illustrates an example coolant flow schematic 500 in the high cooling efficiency data center of FIG. 4, according to one embodiment of the present disclosure. In FIG. 5, fluid in gaseous state (e.g., vapor and air) are illustrated using arrows in dashed lines; fluid in liquid state (e.g., liquid of the two-phase coolant) is illustrated using arrows in solid lines. Similar line patterns of the arrows indicate similar temperature ranges.

Referring to both FIGS. 4 and 5, the vapor 520 may be generated in the one or more two-phase cooling enclosures 250. The vapor 520 raises to the vapor containment 422 automatically. The vapor containment 422 includes an internal cooling device 550. The internal cooling device 550 may condense a portion of the vapor 520 and returns the liquid 530 to one or more of the immersion tanks in the system layer 100. The other portion 522 of vapor 520 may enter the channel 432 automatically from the vapor containment 422. The portion of vapor 522 may be transferred to the gas-to-gas core 440 as the vapor 524, which transfers heat to the air 516 and becomes condensed. The condensed fluid 532 then returns to the one or more immersion tanks of the two-phase cooling enclosures 250.

On the side of the air cooling enclosures, cool air supply 510 (e.g., fresh air at room temperature) may freely enter the system layer 100. In some embodiments, the air containment 424 has a lower pressure than the air pressure surrounding the system layer 100 and causes the air supply 510 to flow toward the air containment 424 through the air cooling enclosures. As such, the exhaust air 512 (e.g., air that has absorbed heat from the air cooling enclosures) raises toward the air entrainment 424 (due to both the pressure difference and density differences as warm air is lighter than cool air).

In some embodiments, the cool air supply 510 enters the electronic racks through their frontends and the warm/hot airflows exit the electronic racks from their backends. The warm/hot air with exchanged heat is exhausted from room/building or cooled using a separate cooling system such as an air-to-liquid heat exchanger. Thus, the cooling system is a hybrid liquid-air cooling system, where a portion of the heat generated by a processor is removed by cooling liquid via the corresponding cold plate, while the remaining portion of the heat generated by the processor (or other electronics or processing devices) is removed by airflow cooling.

The exhaust air 512 may enter the channel 434 via the air containment 424 as air 514. In some cases, the air 514 may be powered by a fan. The air 514 may enter the gas-to-gas core 440 as the exhaust air 512 and 516 continuous to absorb heat from the vapor 524. The hot air 540 then exits the air channel 450 for removal or cooling. Because the hot air 540 now carries the heat from both types of enclosures (e.g., the different types of enclosures of the data center), the hot air 540 has a larger temperature difference against any defined cooling than the warm air 514. This larger temperature difference thus allows for a more efficient heat removal and cooling source usage. If the internal cooling unit is integrated within each of the immersion enclosure, then 520 can be understood as the portion of vapor which is not condensed within the enclosure, such as through leakage.

Figure 6:
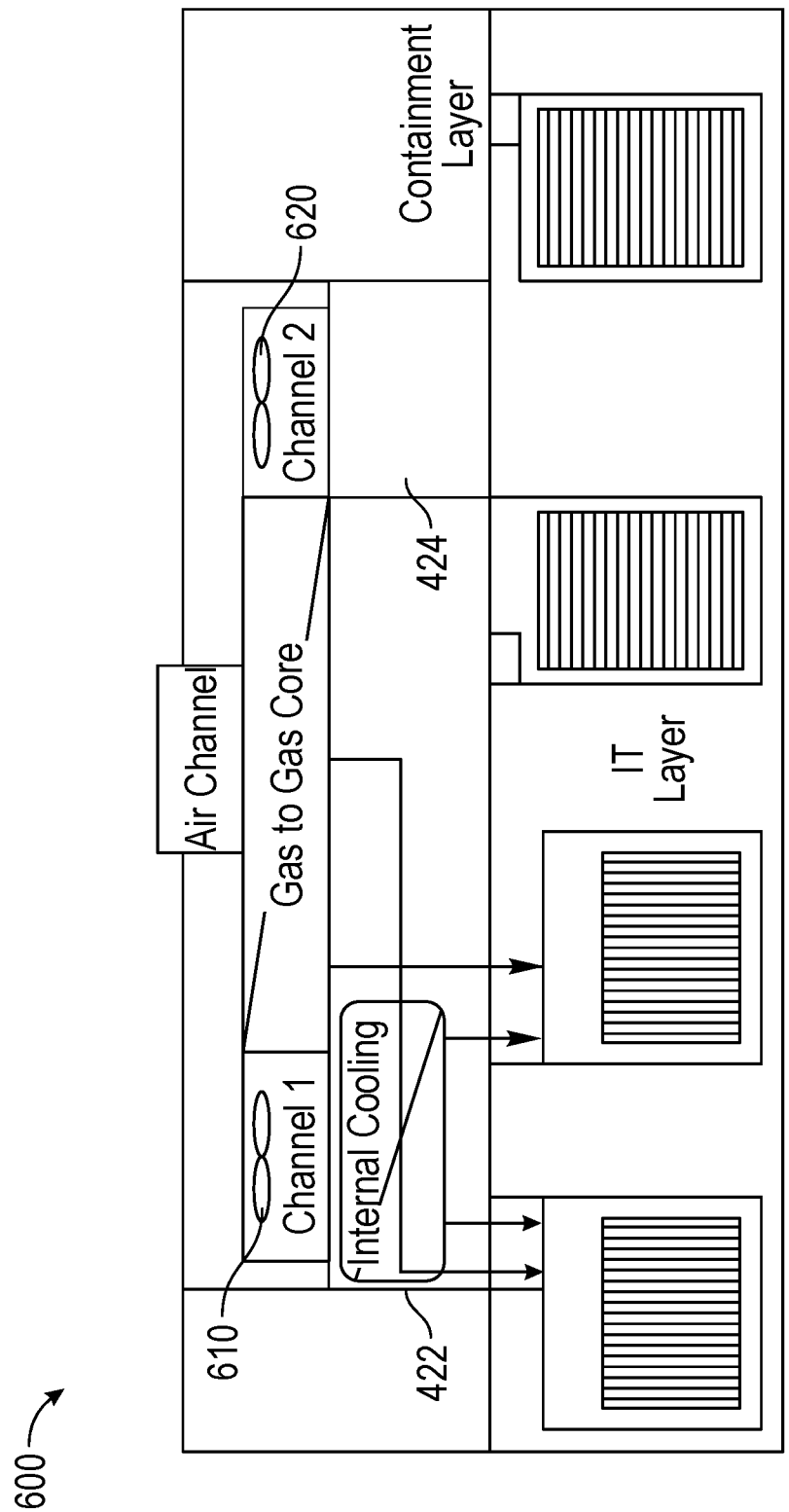
FIG. 6 illustrates an example data center including IT clusters of different cooling types of the schematic in FIG. 3, according to one embodiment of the present disclosure.

In some cases, the temperature of the air 516 may be controlled, as shown in FIG. 6, for example. FIG. 6 illustrates another example high cooling efficiency data center 600 similar to the data center 400 with additional fans or blowers 610 and 620.

In FIG. 6, the fan or blower 620 may control the overall flow rate in the air cooling enclosures. When the cool air supply temperature is constant and the heat generated at the air cooling enclosures is constant, the higher the air flow rate caused by the fan 620, the lower the temperature of the air 516. By lowering the temperature of the air 516, the gas-to-gas core 440 can be configured to fully condense the vapor 524 and return the two-phase fluid back to the immersion tanks. This way, the operating two-phase fluid in the two-phase cooling enclosures may be contained (e.g., without requiring external two-phase fluid supply). Such circulation further enhances the operation of the data center having multiple types of cooling enclosures.

As shown in FIG. 6, another fan or blower 610 in the channel 432 for the vapor 522 may control the flow rate (and thus the return rate) of the vapor from the two-phase cooling enclosures. The fan 610 may be controlled collaboratively with the fan 620 to handle fluctuating heat generation in system layer. For example, the vapor circulation rate controlled by the fan 610 may increase when additional heat is generated in the two-phase cooling enclosures. The additional heat increases the heat exchange efficiency at the gas-to-gas core 440, until a threshold temperature of the warm air 516 is reached. The threshold temperature is the temperature above which not all vapor 524 can be returned to the immersion tanks. To maintain the threshold temperature, the fan 620 may increase the flow rate (e.g., increasing the intake of cool air). Such equilibrium results in an efficient cooling in the data center (likewise, the fans 610 and 620 may decrease respective flow rates to maintain the equilibrium when less heat is produced). The control of the fans of 610 and 620 can be implemented with different control strategies.

Figure 7:
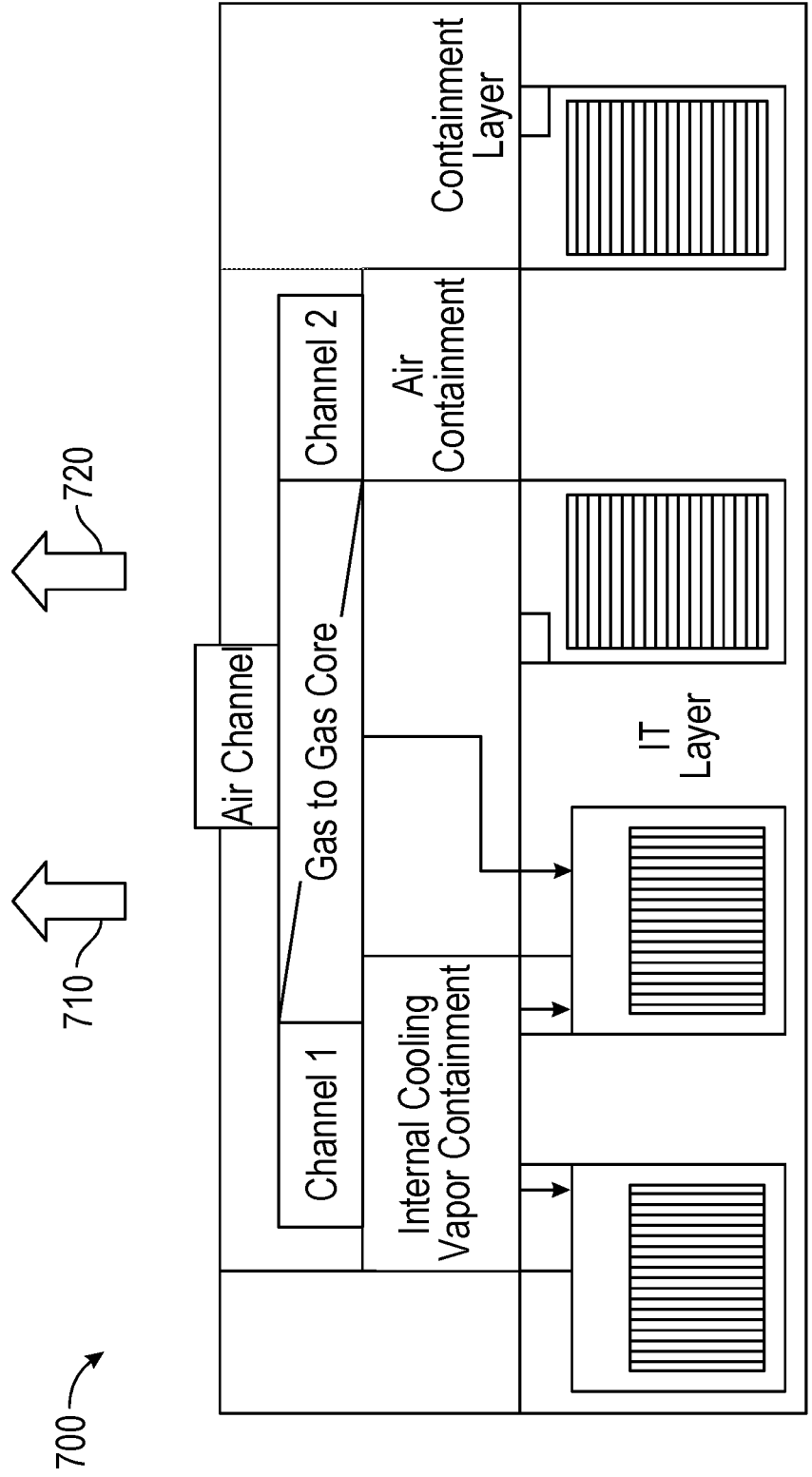
FIG. 7 illustrates an example data center including IT clusters of different cooling types of the schematic in FIG. 3, according to one embodiment of the present disclosure.

FIG. 7 illustrates an example high cooling efficiency data center 700 including IT clusters of different cooling types of the schematic in FIG. 3, according to one embodiment of the present disclosure. FIG. 7 shows alternative ways to make use of the hot air output from the data center 700. The hot air 710 may be directed to a cooling unit (e.g., heat removal or disposal). The hot air 720 may be directed to a thermal recovery system (e.g., generating electricity using the absorbed heat). The ratio between the hot air 710 and 720 may be determined based on specific configurations (e.g., cost for cooling and cost for recovery).

In some embodiments, in general, a heterogeneous data center includes one or more different types of cooling systems including an electronic rack that includes the server chassis including the IT components and an electronic rack that includes an immersion container containing a cooling liquid to submerge the server chassis, as described above. A cooling device is on electronic rack that includes lines, as described above. For example, a cooling device is on an extension frame of the immersion container. An extension frame includes an extensible section that includes one or more fans to extend outside the rack and guide a vapor flow to cooling device.

Embodiments of the cooling systems and apparatuses described herein provide various configurations for IT clusters and the servers. Embodiments of the cooling systems and apparatuses described herein can be beneficially integrated with different fluid systems. Embodiments of the cooling systems and apparatuses described herein can be used for designing different heterogeneous clusters, as described above. Embodiments of the cooling systems and apparatuses described herein provide the hardware infrastructure capability, service quality and availability while reducing the cost. A robust system architecture, control and operation as described herein benefit the service providers in multiple aspects in a long term. Embodiments of the cooling systems and apparatuses described herein provide high resilience and flexible configurations to accommodate dynamic variations in software, application and business requirements, and at the same time decrease cost.

In general, an electronic rack applicable with the present disclosure may include any of the electronic racks as described throughout this application. According to one embodiment, an electronic rack includes, but is not limited to, a supply line, a rack management unit (RMU), and one or more server chassis. Server chassis can be inserted into an array of server slots (e.g., standard shelves) respectively from frontend or backend of electronic rack. Each server chassis may include one or more blade slots to receive one or more server blades. Each server blade represents one or more servers therein.

Any number of server chassis may be maintained within electronic rack. The particular positions of heat exchanger, RMU, and/or server chassis may be configured in various manners. In one embodiment, electronic rack can be either open to the environment or partially contained by a rack container, as long as the cooling fans can generate airflows from the frontend to the backend.

In addition, for at least some of the server chassis, an optional fan module is associated with the server chassis. Each of the fan modules includes one or more cooling fans. The fan modules may be mounted on the backends of server chassis or on the electronic rack to generate airflows flowing from frontend, traveling through the air space of the sever chassis, and exiting at backend of electronic rack.

In one embodiment, the supply line may provide coolant in liquid phase from a source to the rack. In some cases, the supply line may be powered by a pump to supply coolant to the server chassis. The coolant may be a two-phase coolant. The separator separates the coolant in the vapor state from the coolant in liquid state. The coolant in the liquid state may return to the supply line via a pump-free conduit, such as by using gravity, surface tension, or other pump-free means. In some cases, one or more pumps may be used between the supply line and one or more individual sub-cooling systems in each of the server chassis.

Each of server chassis may include one or more information technology (IT) components (e.g., electronic devices such as processors, memory, and/or storage devices). The coolant removes the heat generated from the electronic device attached thereon. The coolant carrying the exchanged heat exits the server chassis via conduits and reaches one or more separators, which separates the coolant in liquid state from the coolant in vapor state. The coolant in liquid state is returned to the supply line via the pump-free conduits.

In another embodiment, some of the server chassis may include an immersion tank containing immersion coolant therein. The electronic devices of the corresponding server (s) are at least partially submerged into the immersion coolant. The immersion coolant may be dielectric cooling fluid, which may be circulated between the immersion tanks and heat exchanger (not shown). The coolant may be a single-phase coolant or two-phase coolant (also referred to as phase-change coolant). The two-phase coolant evaporates from a liquid form into a vapor form when the temperature of the coolant is above a predetermined temperature threshold (e.g., the boiling point of the coolant). The vapor flows upstream via the vapor line associated with one or more separators from the corresponding server chassis to heat exchanger. Heat exchanger may include a condenser to condense the vapor from the vapor form back to the liquid form, where the coolant is then supplied back to the server chassis.

Note that some of the server chassis may be configured with single-phase liquid cooling, while other server chassis may be configured with two-phase liquid cooling. Even within a single server chassis, some of the IT components may be configured with single-phase liquid cooling, while other IT components may be configured with two-phase liquid cooling. A rack manifold may include a first rack manifold for single-phase cooling and a second rack manifold for two-phase cooling to be coupled to the same or different server chassis for different types of cooling. Some of the sever chassis may be configured with regular liquid and air cooling, while other server chassis may be configured with immersion cooling.

Some of the IT components may perform data processing tasks, where the IT components may include software installed in a machine-readable medium such as a storage device, loaded into a memory, and executed by one or more processors to perform the data processing tasks. Server chassis may include a host server (referred to as a host node) coupled to one or more compute servers (also referred to as computing nodes). The host server (having one or more central processing units or CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the computing nodes or compute servers (having one or more graphics/general processing units or GPUs) managed by the host server. The compute servers perform the actual tasks, which may generate heat during the operations.

Electronic rack further includes optional RMU configured to provide and manage power supplied to servers and heat exchanger. RMU may be coupled to a power supply unit (not shown) to manage the power consumption of the power supply unit. The power supply unit may include the necessary circuitry (e.g., an alternating current (AC) to direct current (DC) or DC to DC power converter, battery, transformer, or regulator, etc.,) to provide power to at least some of the remaining components of electronic rack.

In one embodiment, RMU includes optional optimization module and rack management controller (RMC). RMC may include a monitor to monitor operating status of various components within electronic rack, such as, for example, computing nodes, heat exchanger, and the fan modules. Specifically, the monitor receives operating data from various sensors representing the operating environments of electronic rack. For example, the monitor may receive operating data representing temperatures of the processors, coolant, and airflows, which may be captured and collected via various temperature sensors. The monitor may also receive data representing the fan power and pump power generated by one or more fan modules and liquid pumps, which may be proportional to their respective speeds. These operating data are referred to as real-time operating data. Note that the monitor may be implemented as a separate module within RMU.

Based on the operating data, optimization module performs an optimization using a predetermined optimization function or optimization model to derive a set of optimal fan speeds for the fan modules and an optimal pump speed for a liquid pump, such that the total power consumption of the liquid pump and the fan modules reaches minimum, while the operating data associated with the liquid pump and cooling fans of the fan modules are within their respective designed specifications. Once the optimal pump speed and optimal fan speeds have been determined, RMC configures the liquid pump and cooling fans of the fan modules based on the optimal pump speeds and fan speeds.

FIG. 8 is a flow chart of example operations 800 of a high cooling efficiency data center including IT clusters of different cooling types, according to one embodiment of the present disclosure. The example operations 800 may be applicable to one or more of the data center examples discussed herein (e.g., data center 400 of FIG. 4).

The operations 800 begins, at block 810, by receiving, at a vapor condensation region of a core unit, vapor of a two-phase cooling fluid from a first type of cooling enclosures comprising immersion tanks, the first type of cooling enclosures cooled by closed two-phase cooling.

At block 820, at a hot air region of the core unit, hot air is received from a second type of cooling enclosures cooled by cooling air.

At block 830, heat is exchanged between the vapor condensation region and the hot air region.

At block 840, at least a portion of the condensed vapor in liquid form is returned after exchanging heat to the immersion tanks of the first type of cooling enclosures. The first type of cooling enclosures is situated in a system layer enclosing a plurality rows of enclosures of electronic racks, the plurality rows of enclosures comprising the first type of cooling enclosures and the second type of cooling enclosures.

In some embodiments, operations 800 further includes supplying fresh cool air to the second type of cooling enclosures at an air supply; and removing hot air from the core unit after exchanging heat between the vapor condensation region and the hot air region. In some cases, a rate of intake of the fresh cool air may be varied at the air supply such that the vapor in the vapor condensation region is fully condensed to return to the immersion tanks of the first type of cooling enclosures.

In some embodiments, the vapor may be transferred, in a vapor containment, from the first type of cooling enclosures to the vapor condensation region of the core unit. The hot air may be transferred, in an air containment, from the second type of cooling enclosures to the hot air region of the core unit. The vapor containment, the air containment, and the core unit are part of a containment layer. In some cases, a rate of flow of the hot air may be regulated, in the second type of cooling enclosures, by a blower in the air containment, to vary the rate of heat exchange between the vapor and the hot air in the core unit.

In some embodiments, at least a portion of vapor from the first type of cooling enclosures, may be condensed by an internal vapor cooling unit in the vapor containment, to return to the immersion tanks of the first type of cooling enclosures.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

What is claimed is:

1. A cooling system, comprising:
   a system layer enclosing at least part of a plurality rows of enclosures, including a first type of cooling enclosures using air cooling and a second type of cooling enclosures using immersion two-phase cooling;
   a containment layer disposed on top of the system layer, the containment layer comprising a vapor containment and a hot air containment, wherein the vapor containment is to receive and contain vapor from immersion tanks of the second type of cooling enclosures, and wherein the hot air containment to receive and contain hot air from the first type of cooling enclosures; and
   a heat exchanger to separately receive the vapor from the vapor containment and the hot air from the hot air containment and to perform an air-to-air heat exchange between the vapor and hot air.

2. The cooling system of claim 1, wherein the heat exchanger is configured to condense the vapor of a two-phase coolant to a liquid form of the two-phase coolant using the hot air.

3. The cooling system of claim 1, wherein the hot air containment encloses hot aisles of cooling enclosures of the first type to receive and contain the hot air from the cooling enclosures of the first type.

4. The cooling system of claim 1, further comprising:
   a return conduit connecting the heat exchanger to the system layer for returning a condensed portion of the vapor after the heat exchange to the immersion tanks of the second type of cooling enclosures.

5. The cooling system of claim 1, further comprising:
   a cooling air supply coupled to the first type of cooling enclosures in the system layer, the cooling air supply providing fresh cool air to the first type of cooling air enclosures; and
   a hot air exit coupled to the heat exchanger for hot air exhaust the heat exchanger after heat exchange between the vapor and the hot air.

6. The cooling system of claim 1, further comprising an internal vapor cooling unit disposed in the containment layer to
   condense a portion of the vapor in the vapor containment; and
   return the condensed vapor in a liquid form to the immersion tanks of the second type of cooling enclosures.

7. The cooling system of claim 6, wherein a remainder of the vapor arises upwardly to the heat exchanger, wherein the remainder of the vapor is condensed by the heat exchanger using the hot air.

8. The cooling system of claim 7, further comprising:
   a first set of liquid lines to return liquid from the internal vapor cooling unit to the immersion tanks of the second type of cooling enclosures; and
   a second set of liquid lines to return liquid from the heat exchanger to the immersion tanks of the second type of cooling enclosures.

9. The cooling system of claim 1, further comprising a blower in the hot air containment or the vapor containment to vary a rate of heat exchange between the vapor and the hot air by controlling a rate of input of fresh cool air to the first type of cooling enclosures or a rate of input of vapor to enter the heat exchanger.

10. The cooling system of claim 1, further comprising an air channel to allow the hot air to exit to an external environment from the heat exchanger after performing the heat exchange.

11. A method for data center cooling, comprising:
    enclosing within a system layer at least part of a plurality rows of enclosures, including a first type of cooling enclosures using air cooling and a second type of cooling enclosures using immersion two-phase cooling;
    providing a containment layer disposed on top of the system layer, the containment layer comprising a vapor containment and a hot air containment, including receiving and containing within the vapor containment vapor from immersion tanks of the second type of cooling enclosures, and receiving and containing within the hot air containment hot air from the first type of cooling enclosures; and
    performing an air-to-air heat exchange between the vapor and hot air using a heat exchanger that separately receives the vapor from the vapor containment and the hot air from the hot air containment.

12. The method of claim 11, wherein the heat exchanger is configured to condense the vapor of a two-phase coolant to a liquid form of the two-phase coolant using the hot air.

13. The method of claim 11, wherein the hot air containment encloses hot aisles of cooling enclosures of the first type to receive and contain the hot air from the cooling enclosures of the first type.

14. The method of claim 11, wherein a return conduit is connected between the heat exchanger to the system layer for returning a condensed portion of the vapor after the heat exchange to the immersion tanks of the second type of cooling enclosures.

15. The method of claim 11, further comprising:
    forming a cooling air supply coupled to the first type of cooling enclosures in the system layer, the cooling air supply providing fresh cool air to the first type of cooling air enclosures; and
    forming a hot air exit coupled to the heat exchanger for hot air exhaust the heat exchanger after heat exchange between the vapor and the hot air.

16. The method of claim 11, wherein an internal vapor cooling unit is disposed in the containment layer to
- condense a portion of the vapor in the vapor containment; and
- return the condensed vapor in a liquid form to the immersion tanks of the second type of cooling enclosures.

17. The method of claim 16, wherein a remainder of the vapor arises upwardly to the heat exchanger, wherein the remainder of the vapor is condensed by the heat exchanger using the hot air.

18. The method of claim 17, further comprising:
- providing a first set of liquid lines to return liquid from the internal vapor cooling unit to the immersion tanks of the second type of cooling enclosures; and
- providing a second set of liquid lines to return liquid from the heat exchanger to the immersion tanks of the second type of cooling enclosures.

19. The method of claim 11, wherein a blower is utilized in the hot air containment or the vapor containment to vary a rate of heat exchange between the vapor and the hot air by controlling a rate of input of fresh cool air to the first type of cooling enclosures or a rate of input of vapor to enter the heat exchanger.

20. The method of claim 11, wherein an air channel is utilized to allow the hot air to exit to an external environment from the heat exchanger after performing the heat exchange.

* * * * *